United States Patent
Bouche et al.

(10) Patent No.: US 7,612,488 B1
(45) Date of Patent: Nov. 3, 2009

(54) METHOD TO CONTROL BAW RESONATOR TOP ELECTRODE EDGE DURING PATTERNING

(75) Inventors: Guillaume Bouche, Portland, OR (US); Ralph N. Wall, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 219 days.

(21) Appl. No.: 11/654,244

(22) Filed: Jan. 16, 2007

(51) Int. Cl.
*H01L 41/06* (2006.01)

(52) U.S. Cl. .................. 310/364; 310/320; 310/365

(58) Field of Classification Search .......... 310/363–366
See application file for complete search history.

(56) References Cited

U.S. PATENT DOCUMENTS

| | | | | |
|---|---|---|---|---|
| 4,692,653 | A * | 9/1987 | Kushida et al. | 310/334 |
| 5,589,810 | A * | 12/1996 | Fung | 338/4 |
| 5,692,279 | A * | 12/1997 | Mang et al. | 29/25.35 |
| 5,844,347 | A | 12/1998 | Takayama et al. | 310/313 R |
| 6,291,931 | B1 | 9/2001 | Lakin | 310/364 |
| 6,307,447 | B1 | 10/2001 | Barber et al. | 333/189 |
| 6,407,649 | B1 | 6/2002 | Tikka et al. | 333/133 |
| 6,500,678 | B1 * | 12/2002 | Aggarwal et al. | 438/3 |
| 6,937,114 | B2 * | 8/2005 | Furukawa et al. | 333/154 |
| 7,148,610 | B2 * | 12/2006 | Jacot et al. | 310/364 |
| 7,220,600 | B2 * | 5/2007 | Summerfelt et al. | 438/3 |
| 7,276,836 | B2 * | 10/2007 | Umeda et al. | 310/320 |
| 7,466,537 | B2 * | 12/2008 | Nakayama | 361/311 |
| 2004/0115881 | A1 | 6/2004 | Choi et al. | 438/240 |
| 2005/0099100 | A1 * | 5/2005 | Kita et al. | 310/367 |
| 2006/0131990 | A1 | 6/2006 | Milsom et al. | 310/311 |
| 2007/0152540 | A1 * | 7/2007 | Fujii et al. | 310/324 |
| 2008/0157632 | A1 * | 7/2008 | Williams | 310/364 |

FOREIGN PATENT DOCUMENTS

JP 2004-135163 A 4/2004

OTHER PUBLICATIONS

Tapani Makkonen, Tuomas Pensala, Juha Vartiainen, Jouni V. Knuuttila, Jyrki Kaitila, Martti M. Salomaa, "*Estimating Materials Parameters in Thin-Film BAW Resonators Using Measured Dispersion Curves*," Jan. 2004, pp. 42-51, IEEE, vol. 51., No. 1.
R. Aigner, J. Ella, H.-J. Elbrecht, W. Nessler, S. Marksteiner, "Advancement of MEMS into RF-Filter Applications,"2002, pgs. 1-4, IEEE.
Kenneth M. Lakin, Gerald R. Klein, Kevin T. McCarron, "High-Q Microwave Acoustic Resonators and Filters,"Dec., 1993, pgs. 2139-2146, IEEE Transaction on Microwave Theory and Techniques, vol. 41 No. 12.
K. M. Lakin, "Thin Film Resonators and High Frequency Filters," Jun. 1, 2001, pgs, 1-18, TFR Technologies, Inc.

* cited by examiner

*Primary Examiner*—Jaydi SanMartin
(74) *Attorney, Agent, or Firm*—Haverstock & Owens, LLP

(57) ABSTRACT

A piezoelectric resonator include a multi-layer top electrode. The multi-layer top electrode includes at least a top metal layer and a bottom metal layer. A top metal layer edge is recessed compared to a bottom metal layer edge allowing conformal deposition of a passivation layer. The passivation layer covers and protects the underlying layers from subsequent etching, thereby preventing etch undercut of the top electrode. In some embodiments, the multi-layer top electrode is configured as a bi-layer. In other embodiments, an extra layer is configured between the top metal layer and the bottom metal layer, for example a shunt load layer.

28 Claims, 4 Drawing Sheets

METHOD TO CONTROL BAW RESONATOR TOP ELECTRODE EDGE DURING PATTERNING

FIELD OF THE INVENTION

The present invention relates to the field of piezoelectric resonators. More particularly, the present invention relates to the field of a bulk acoustic wave (BAW) resonator and a method of controlling a top electrode edge of a BAW resonator during patterning.

BACKGROUND OF THE INVENTION

Piezoelectric resonators are primarily used in RF filters and oscillators. RF filters are increasingly being used in mobile communications devices. These resonators are commonly referred to as bulk acoustic wave (BAW) resonators. Other acronyms for the same or similar devices include FBAR (thin-film bulk acoustic resonators), SMR (solidly mounted resonators), TFR (thin film resonators), or SCR (stacked crystal resonators). The resonators are interconnected, typically at the upper metal level, to build RF filters.

It is known that a bulk acoustic wave (BAW) resonator in general comprises a piezoelectric layer sandwiched between two electronically conductive layers that serve as electrodes. When a radio frequency (RF) signal is applied across the device, it produces a mechanical wave in the piezoelectric layer. BAW resonators are typically fabricated on silicon (Si), gallium arsenide (GaAs), glass, or ceramic substrates. BAW resonators are typically manufactured using various thin film manufacturing techniques, such as for example sputtering, vacuum evaporation or chemical vapor deposition. BAW resonators utilize a piezoelectric thin film layer for generating the acoustic bulk waves. The resonance frequencies of typical BAW resonators range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of an acoustically active piezoelectric layer, electrodes on opposite sides of the piezoelectric layer, and an acoustical isolation from the substrate. Although the resonant frequency of a BAW device also depends on other factors, the thickness of the piezoelectric layer is a predominant factor in determining the resonant frequency. As the thickness of the piezoelectric layer is reduced, the resonance frequency is increased.

The material used to form the electrode layers is an electrically conductive material. The acoustical isolation is produced with a substrate via-hole, a micromechanical bridge structure, or with an acoustic mirror structure. In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need much modification, unlike with the via-hole structure. A bridge structure can also be produced using an etch pit structure, in which case a pit is etched in the substrate or the material layer below the BAW resonator to produce the free standing bridge structure.

FIG. 1 illustrates a cross-section of a conventional piezoelectric resonator. The piezoelectric resonator includes a substrate 10, an acoustic mirror or acoustic reflector 20, a bottom electrode 30, a piezoelectric layer 40, and a top electrode 50. The top electrode can be constructed from several metallic and dielectric layers. The bottom electrode 30 can also be constructed from several metallic and dielectric layers; molybdenum is typically used. The top electrode 50 shown in FIG. 1 includes a bottom metal layer 52 of a material with high acoustic impedance, and a top metal layer 54 of a material with low impedance.

FIGS. 2-5 illustrate conventional fabrication steps to form the top electrode 50. As illustrated in FIG. 2, the bottom metal layer 52 is deposited on the piezoelectric layer 40. The top metal layer 54 is then deposited upon the bottom layer 52. The top metal layer 54 is then patterned, selectively to underlaying layer 52 (FIG. 3) and resist removed. Bottom metal layer 52 is then etched using top metal layer 54 as a hard mask (FIG. 4). As a result, a portion 56 of the bottom metal layer 52 is also etched forming a recess underneath the top metal layer 54 (FIG. 5). Additionally, when an interconnect metal layer is fabricated to make contact with the top electrode 50, further undercutting of the top layer 54 can occur during an etch step of the interconnect metal layer. In either case, undercutting of the top metal layer 54 negatively impacts the performance of the piezoelectric resonator.

During fabrication of conventional piezoelectric resonators, such as the process illustrated in FIGS. 2-5, problems arise during etching of the bi-layer top electrode and during etching of the metallization layer that contacts the top electrode bi-layer stack. The difficulty is finding etches that do not preferentially attack the bottom metal layer 52 causing undercut voiding at the device periphery. This is particularly true if wet etching is employed because of various galvanic and catalytic reactions that do occur.

SUMMARY OF THE INVENTION

Embodiments of a piezoelectric resonator include a multilayer top electrode. The multi-layer top electrode includes at least a top metal layer and a bottom metal layer. A top metal layer edge is recessed compared to a bottom metal layer edge allowing conformal deposition of a passivation layer. The passivation layer covers and protects the underlying layers from subsequent etching, thereby preventing etch undercut of the top electrode. Preventing etch undercut provides a superior piezoelectric resonator architecture because of good control of the active area in-plane dimensions. In some embodiments, the multi-layer top electrode is configured as a bi-layer. In other embodiments, an extra layer is configured between the top metal layer and the bottom metal layer, for example a shunt load layer.

Standard IC fabrication methods are used for the basic manufacturing sequences, including depositions, photolithography, and etch processes. MEMS techniques can also be employed for packaging and resonator acoustic isolation from the substrate.

The multi-layer top electrode construction is desirable in BAW resonator design that require stringent acoustic, electrical, and process integration requirements. By using two distinct materials for the multi-layer configuration, it is possible to benefit from the unique properties of each material.

In one aspect of the present invention, a piezoelectric resonator is disclosed. The piezoelectric resonator includes a bottom electrode, a piezoelectric layer coupled to the bottom electrode, a top electrode coupled to the piezoelectric layer, and a passivation layer coupled to the top electrode. The top electrode comprises a bottom metal layer and a top metal layer configured such that a perimeter edge of the top metal layer is recessed relative to a perimeter edge of the bottom metal layer. The passivation layer is coupled to the top electrode such that the top metal layer and the bottom metal layer are isolated from a subsequent metal etch step. The bottom metal layer can be a refractory metal. The bottom metal layer can be a tungsten alloy. The bottom metal layer can be molybdenum, ruthenium, tungsten, platinum, osmium, rhenium or iridium. The top metal layer can be aluminum, gold, platinum, or an aluminum alloy composition. The top metal layer can be a metal alloy composition. The passivation layer can include an etched contact area, and the piezoelectric resonator can also include an interconnect metal layer coupled to the top electrode at the etched contact area. In some embodiments, the interconnect metal layer can include a first interconnect metal layer and a second interconnect metal layer. In this case, the first interconnect metal layer can be titanium tungsten, and the second interconnect metal layer can be aluminum copper or copper. In other embodiments, the interconnect metal layer can be titanium tungsten, tungsten, or molybdenum. The interconnect metal layer can be a metal material that is selectively etched relative to the passivation layer. The piezoelectric resonator can be a bulk acoustic wave resonator. The passivation layer is initially configured such that all exposed portions of the top metal layer and the bottom metal layer are covered.

In another aspect of the present invention, a method of fabricating a piezoelectric resonator is disclosed. The method includes providing a bottom electrode. A piezoelectric layer is coupled to the bottom electrode. A bottom metal layer of a top electrode is deposited on the piezoelectric layer. A top metal layer of the top electrode is deposited on the bottom metal layer. A photoresist layer is deposited on the top metal layer and then patterned and etched. The top metal layer is etched while the etched photoresist layer remains in place as an etch mask. The bottom metal layer is etched such that a perimeter edge of the top metal layer is recessed relative to a perimeter edge of the bottom metal layer. The etched photoresist layer is removed. A passivation layer is deposited on the top metal layer and the bottom metal layer such that the top metal layer and the bottom metal layer are isolated from a subsequent metal etch step. The passivation layer initially covers all exposed portions of the top metal layer and the bottom metal layer. The method can also include patterning and etching the passivation layer to form a contact area for the top electrode, depositing an interconnect metal layer on the passivation layer, and patterning and etching the interconnect metal layer to form a metal interconnect for the top electrode at the contact area. In some embodiments, the interconnect metal layer can be a first interconnect metal layer and a second interconnect metal layer. In this case, the first interconnect metal layer can be titanium tungsten, and the second interconnect metal layer can be aluminum copper or copper. In other embodiments, the interconnect metal layer can be titanium tungsten, tungsten, or molybdenum. The interconnect metal layer can be a metal material that is selectively etched relative to the passivation layer. The piezoelectric resonator can be a bulk acoustic wave resonator. The bottom metal layer can be a refractory metal. The bottom metal layer can be a tungsten alloy. The bottom metal layer can be molybdenum, ruthenium, tungsten, platinum, osmium, rhenium or iridium. The top metal layer can be aluminum, gold, platinum, or an aluminum alloy composition. The top metal layer can be a metal alloy composition. Etching the top metal layer can be performed by a wet etch process. Etching the bottom metal layer can be performed by a dry etch process.

In yet another aspect of the present invention, another piezoelectric resonator is disclosed. The piezoelectric resonator includes a bottom electrode, a piezoelectric layer coupled to the bottom electrode, a top electrode coupled to the piezoelectric layer, a passivation layer coupled to the top electrode, and an interconnect metal layer coupled to the top electrode. The top electrode comprises a bottom metal layer and a top metal layer configured such that a perimeter edge of the top metal layer is recessed relative to a perimeter edge of the bottom metal layer. The passivation layer includes an etched portion configured to provide a contact point with the top electrode, further wherein the passivation layer is further configured to isolate a remaining portion of the top electrode. The interconnect metal layer is coupled to the top electrode at the contact point through the etched portion of the passivation layer. The bottom metal layer can be a refractory metal. The bottom metal layer can be a tungsten alloy. The bottom metal layer can be molybdenum, ruthenium, tungsten, platinum, osmium, rhenium or iridium. The top metal layer can be aluminum, gold, platinum, or an aluminum alloy composition. The top metal layer can be a metal alloy composition. The interconnect metal layer is configured to be in physical contact with the top metal layer and the bottom metal layer at the contact point. In some embodiments, the interconnect metal layer can be a first interconnect metal layer and a second interconnect metal layer. In this case, the first interconnect metal layer can be titanium tungsten, and the second interconnect metal layer can be aluminum copper or copper. The interconnect metal layer can be titanium tungsten, tungsten, or molybdenum. The interconnect metal layer can be a metal material that is selectively etched relative to the passivation layer. The piezoelectric resonator can be a bulk acoustic wave resonator.

BRIEF DESCRIPTION OF THE DRAWINGS

Embodiments of the piezoelectric resonator are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Figure 6:
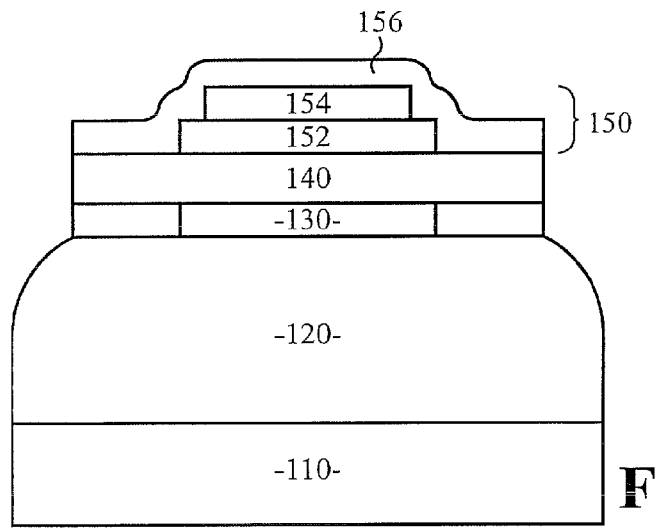
FIG. 6 illustrates a cross-section side view of a first embodiment of the piezoelectric resonator.

FIG. 6 illustrates a cross-section side view of a first embodiment of the piezoelectric resonator. The piezoelectric resonator includes an acoustic mirror or acoustic reflector 120 formed on a substrate 110 preferably by a deposition process.

A bottom electrode 130 is formed on the acoustic reflector 120 preferably by a deposition process. A piezoelectric layer 140 is formed on the bottom electrode 130 preferably by a deposition process. A top electrode 150 is formed on the piezoelectric layer 140 preferably by a deposition process. In this first embodiment, the top electrode 150 is configured as a bi-layer electrode, including a top metal layer 154 formed on a bottom metal layer 152 preferably by a deposition process. The top metal layer 154 is formed relative to the bottom metal layer 152 such that a passivation layer 156 completely covers any exposed portion of both the top metal layer 154 and the bottom metal layer 152. In some embodiments, the outer edges of the top metal layer 154 is recessed compared to the bottom metal layer 152, for example forming a step-like pattern, as shown in FIG. 6. In such a configuration, the passivation layer 156 protects against etch undercut of the bi-layer during subsequent etches.

In some embodiments, the bottom metal layer 152 is made of tungsten or a tungsten alloy, such as titanium tungsten (TiW), and the top metal layer 154 is made of aluminum. TiW is a preferred material for the bottom metal layer 152 because of its acoustic properties. Alternative materials for the bottom metal layer 152 include, but are not limited to, refractory metals such as ruthenium, molybdenum, platinum, osmium, iridium, rhenium, or other acoustically hard materials to optimize the acoustic resonator performance. Aluminum is preferred for the top metal layer 154 because of its high electrical conductivity and for its ability to act as an etch stop during subsequent etch process steps. Alternative materials for the top metal layer 154 include, but are not limited to, an aluminum alloy, gold, platinum, or a specific alloy composition that has a high selectivity from subsequent etch steps. In some embodiments, the passivation layer 156 is silicon nitride. Alternatively, conventional material or composite material that provides a non-reactive layer over the top electrode 150 can be used as the passivation layer.

Figure 7:
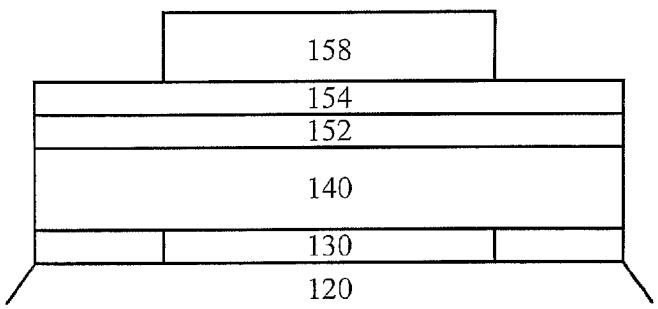
FIGS. 7-10 illustrate exemplary fabrication steps used to fabricate the top electrode of the piezoelectric resonator in FIG. 6.
Figure 8:
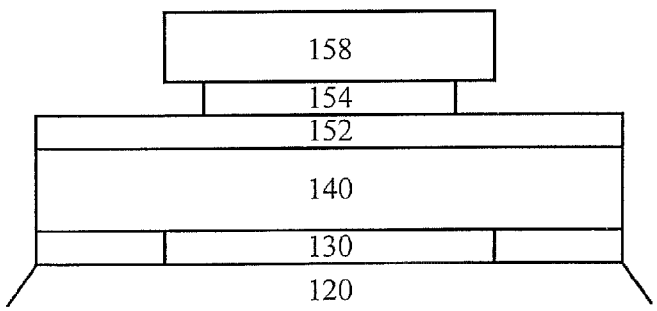

FIGS. 7-10 illustrate exemplary fabrication steps used to fabricate the top electrode of the piezoelectric resonator in FIG. 6. As illustrated in FIG. 7, the bottom metal layer 152 is deposited on the piezoelectric layer 140. The top metal layer 154 is then deposited on the bottom metal layer 152. The top metal layer 154 is then coated with a photoresist layer 158. The photoresist layer 158 is then patterned and etched. The top metal layer 154 is then patterned and etched while maintaining the patterned photoresist layer 158, as illustrated in FIG. 8. In some embodiments, the top metal layer 154 is wet etched, leading to an undercut below the photoresist layer 158.

Figure 9:
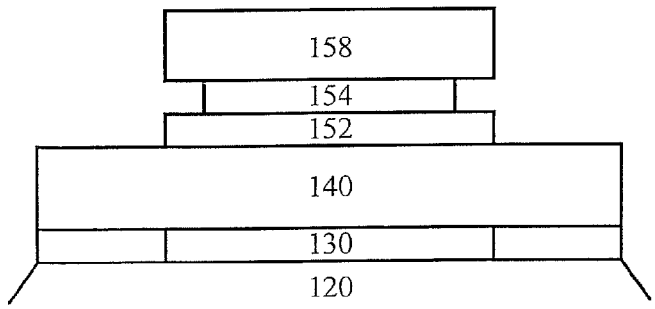
Figure 10:
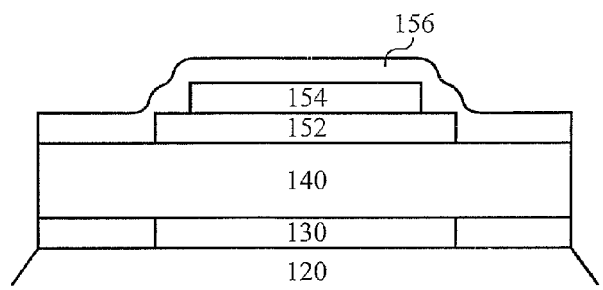

The bottom metal layer 152 is then patterned and etched, as illustrated in FIG. 9. In some embodiments, the bottom metal layer 152 is anisotropically etched with a dry plasma process. The patterned photoresist layer 158 is then removed, and the passivation layer 156 is deposited over the top metal layer 154 and the bottom metal layer 152, as illustrated in FIG. 10. The passivation layer 156 covers any exposed portions of the top metal layer 154 and the bottom metal layer 152.

Figure 1:
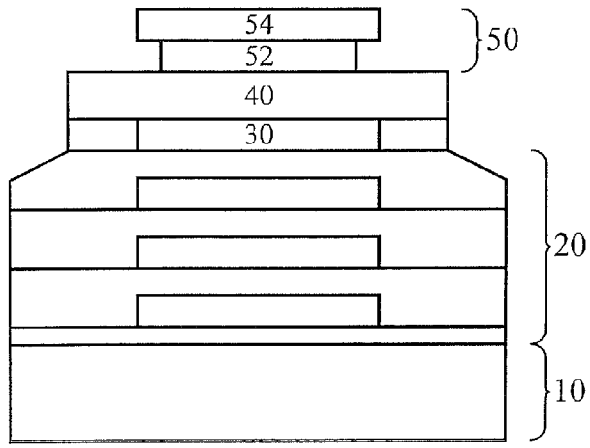
FIG. 1 illustrates a cross-section side view of a conventional piezoelectric resonator.
Figure 2:
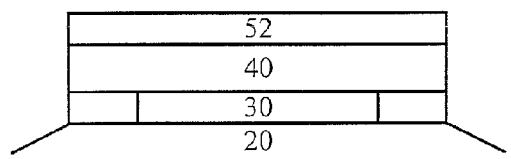
FIGS. 2-5 illustrate exemplary fabrication steps used to fabricate the top electrode of the piezoelectric resonator in FIG. 1.
Figure 3:
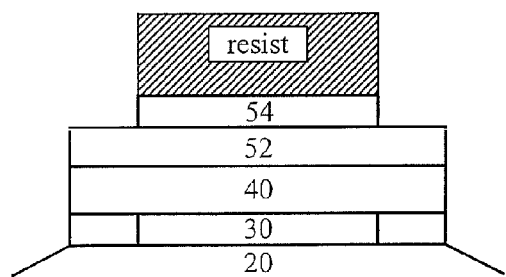
Figure 4:
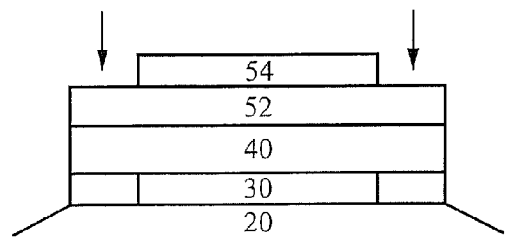
Figure 5:
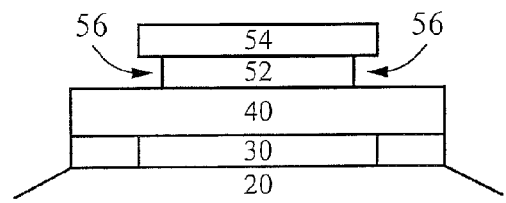
Figure 11:
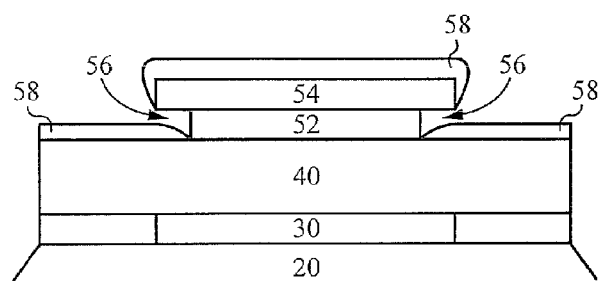
FIG. 11 illustrates the results after a subsequent deposition of a passivation layer on the conventional piezoelectric resonator of FIG. 5.

For comparative purposes, FIG. 11 illustrates the results after a subsequent deposition of a passivation layer 58 on the conventional piezoelectric resonator of FIG. 5. As shown in FIG. 11, the passivation layer 58 does not cover all portions of the top metal layer 54 and the bottom metal layer 52 due to the etch undercut portions 56. As a result, portions of both the top metal layer 54 and the bottom metal layer 52 are exposed to subsequent etches.

Figure 12:
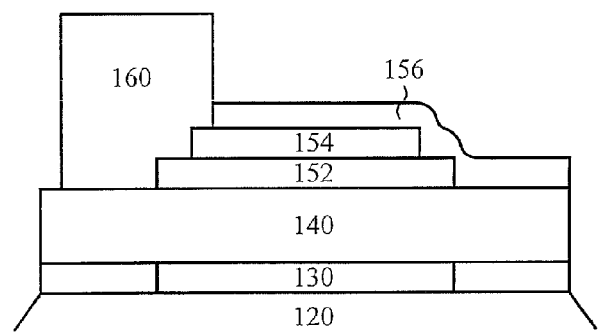
FIG. 12 illustrates an interconnect metal layer added to the piezoelectric resonator of FIG. 10.
Figure 14:
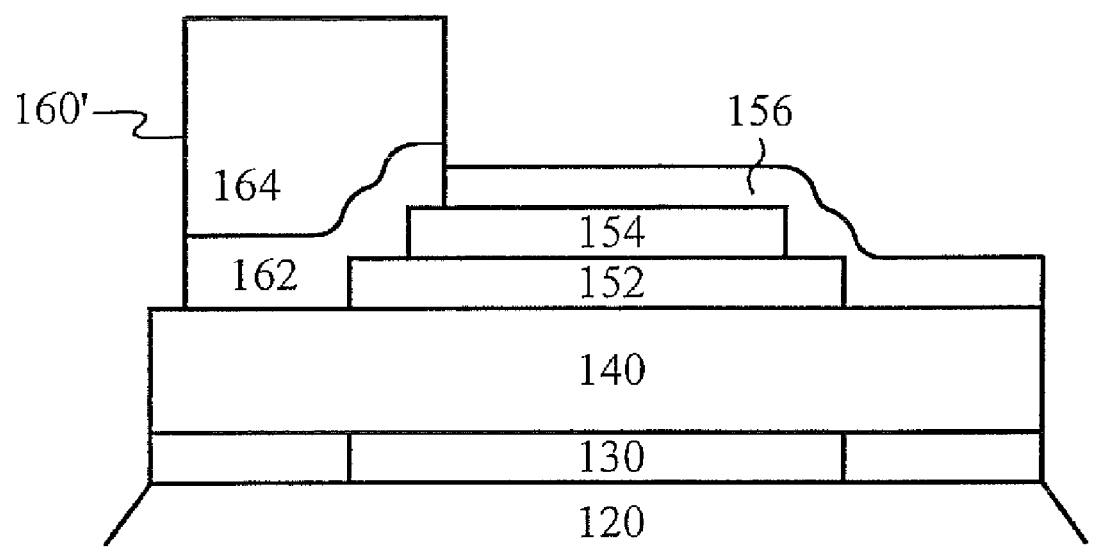
FIG. 14 illustrates an exemplary configuration of the piezoelectric resonator including a bi-layer interconnect metal layer.

FIG. 12 illustrates an interconnect metal layer 160 added to the piezoelectric resonator of FIG. 10. The interconnect metal layer 160 is fabricated by patterning and etching the passivation layer 156 for appropriate contact point with the top electrode 150. The interconnect metal layer 160 is then formed by depositing a metal layer on the exposed portion of the top electrode 150 and the remaining passivation layer 156. The deposited metal layer is then patterned and etched to form the interconnect metal layer 160. In some embodiments, the interconnect metal layer 160 is titanium tungsten (TiW). Alternatively, the interconnect metal layer 160 is tungsten, molybdenum, or any material that is selectively etched relative to the passivation layer 156. For example, a TiW interconnect metal layer is removed selectively from a silicon nitride passivation layer by a peroxide based wet etch. The interconnect metal layer 160 can also comprise of a bi-layer, for example TiW/AlCu or TiW/Cu. In this example, the AlCu or the Cu is for low resistance interconnect, while the TiW can be etched with fine selectivity to the passivation layer 156. In the case where the bi-layer comprises TiW/Cu, the Cu material can be plated upon the TiW layer, with TiW used as a seed conductive layer for the plate-up process. Subsequently, the TiW layer is etched in the field, where the Cu layer has not been electroplated. FIG. 14 illustrates an exemplary configuration of the piezoelectric resonator including a bi-layer interconnect metal layer 160'. The interconnect metal layer 160' includes a first interconnect metal layer 162 and a second interconnect metal layer 164. The relative thickness of the first interconnect metal layer 162 shown in FIG. 14 is for exemplary purposes only. The piezoelectric resonators shown in FIGS. 6 and 12 allow for the stacking of films to create a top electrode that prevents any etch undercut. The interconnect metal layer 160 can be used to build a filter out of a fixed number of resonators.

Figure 13:
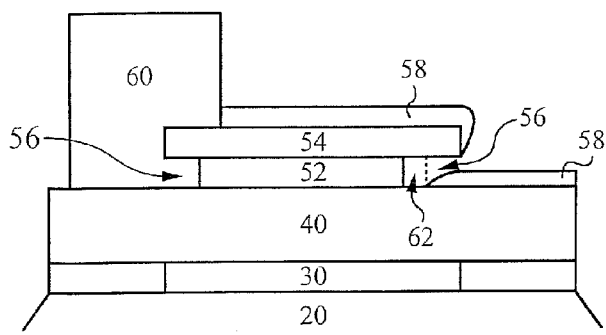
FIG. 13 illustrates the results after a subsequent etch of an interconnect metal layer on the conventional piezoelectric resonator of FIG. 11.

For comparative purposes, FIG. 13 illustrates the results after a subsequent etch of an interconnect metal layer 60 on the conventional piezoelectric resonator of FIG. 11. As is shown in FIG. 13, etching the interconnect metal layer 60 further undercuts the top metal layer 54 by removing an additional portion 62 of the exposed bottom metal layer 52. In contrast, the bottom metal layer 152 of the piezoelectric resonator in FIG. 12 is completely isolated from etching of the interconnect metal layer 160.

The piezoelectric resonator described above in relation to FIGS. 6-10 and 12 are directed to a bi-layer, top electrode configuration. Alternatively, an extra layer can be integrated between the top metal layer and the bottom metal layer, for example a shunt load layer.

The piezoelectric resonator fabrication methods described above can be optimized to reduce lateral spurious modes in the resonator device without additional processing steps. Spurious modes are reduced by uniquely tailored resonator loading at the resonator perimeter. Examples of such resonator loading techniques are described in U.S. Pat. No. 6,812,619, which is hereby incorporated by reference.

It is understood by those skilled in the art that the terms depositing, patterning, and etching used above are intended as general descriptive terms used in the fabrication processes. The fabrication steps described above can be performed using any conventional fabrication methods capable of forming, patterning, and etching the layers described.

The piezoelectric resonators are used as reference oscillators, stand-alone filters, and also as building blocks for RF filters. Such RF filters can be used to replace SAW devices. The piezoelectric devices can also be used in all RF stages of products needing filtering, either band filtering, or channel filtering.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A piezoelectric resonator comprising:
   a. a bottom electrode;
   b. a piezoelectric layer coupled to the bottom electrode;
   c. a top electrode coupled to the piezoelectric layer, wherein the top electrode comprises a bottom metal layer and a top metal layer configured such that an entire perimeter side surface of the top metal layer is recessed relative to a perimeter edge of the bottom metal layer; and
   d. a passivation layer coupled to the top electrode such that the top metal layer and the bottom metal layer are isolated from a subsequent metal etch step.

2. The piezoelectric resonator of claim 1 wherein the bottom metal layer comprises a refractory metal.

3. The piezoelectric resonator of claim 2 wherein the bottom metal layer comprises a tungsten alloy.

4. The piezoelectric resonator of claim 2 wherein the bottom metal layer comprises molybdenum, ruthenium, tungsten, platinum, osmium, rhenium or iridium.

5. The piezoelectric resonator of claim 1 wherein the top metal layer comprises aluminum, gold, platinum, or an aluminum alloy composition.

6. The piezoelectric resonator of claim 1 wherein the top metal layer comprises a metal alloy composition.

7. The piezoelectric resonator of claim 1 wherein the passivation layer includes an etched contact area and the piezoelectric resonator further comprises an interconnect metal layer coupled to the top electrode at the etched contact area.

8. The piezoelectric resonator of claim 7 wherein the interconnect metal layer comprises a first interconnect metal layer and a second interconnect metal layer.

9. The piezoelectric resonator of claim 8 wherein the first interconnect metal layer comprises titanium tungsten.

10. The piezoelectric resonator of claim 8 wherein the second interconnect metal layer comprises aluminum copper or copper.

11. The piezoelectric resonator of claim 7 wherein the interconnect metal layer comprises titanium tungsten, tungsten, or molybdenum.

12. The piezoelectric resonator of claim 7 wherein the interconnect metal layer comprises a metal material that is selectively etched relative to the passivation layer.

13. The piezoelectric resonator of claim 1 wherein the piezoelectric resonator comprises a bulk acoustic wave resonator.

14. The piezoelectric resonator of claim 1 wherein the passivation layer is initially configured such that all exposed portions of the top metal layer and the bottom metal layer are covered.

15. A piezoelectric resonator comprising:
   a. a bottom electrode;
   b. a piezoelectric layer coupled to the bottom electrode;
   c. a top electrode coupled to the piezoelectric layer, wherein the top electrode comprises a bottom metal layer and a top metal layer configured such that a perimeter edge of the top metal layer is recessed relative to a perimeter edge of the bottom metal layer;
   d. a passivation layer coupled to the top electrode, wherein the passivation layer includes an etched portion configured to provide a contact point with the top electrode, further wherein the passivation layer is further configured to isolate a remaining portion of the top electrode; and
   e. an interconnect metal layer coupled to the top electrode at the contact point through the etched portion of the passivation layer.

16. The piezoelectric resonator of claim 15 wherein the bottom metal layer comprises a refractory metal.

17. The piezoelectric resonator of claim 16 wherein the bottom metal layer comprises a tungsten alloy.

18. The piezoelectric resonator of claim 16 wherein the bottom metal layer comprises molybdenum, ruthenium, tungsten, platinum, osmium, rhenium or iridium.

19. The piezoelectric resonator of claim 15 wherein the top metal layer comprises aluminum, gold, platinum, or an aluminum alloy composition.

20. The piezoelectric resonator of claim 15 wherein the top metal layer comprises a metal alloy composition.

21. The piezoelectric resonator of claim 15 wherein the interconnect metal layer is configured to be in physical contact with the top metal layer and the bottom metal layer at the contact point.

22. The piezoelectric resonator of claim 15 wherein the interconnect metal layer comprises a first interconnect metal layer and a second interconnect metal layer.

23. The piezoelectric resonator of claim 22 wherein the first interconnect metal layer comprises titanium tungsten.

24. The piezoelectric resonator of claim 22 wherein the second interconnect metal layer comprises aluminum copper or copper.

25. The piezoelectric resonator of claim 15 wherein the interconnect metal layer comprises titanium tungsten, tungsten, or molybdenum.

26. The piezoelectric resonator of claim 15 wherein the interconnect metal layer comprises a metal material that is selectively etched relative to the passivation layer.

27. The piezoelectric resonator of claim 15 wherein the piezoelectric resonator comprises a bulk acoustic wave resonator.

28. A piezoelectric resonator comprising:
   a. a bottom electrode;
   b. a piezoelectric layer coupled to the bottom electrode;
   c. a top electrode coupled to the piezoelectric layer, wherein the top electrode comprises a bottom metal layer and a top metal layer configured such that a perimeter portion of a top surface of the bottom metal layer is uncovered by the top metal layer; and
   d. a passivation layer coupled to the top electrode such that the top metal layer and the bottom metal layer are isolated from a subsequent metal etch step.

* * * * *